United States Patent [19]

Butler et al.

[11] Patent Number: 5,265,056
[45] Date of Patent: Nov. 23, 1993

[54] SIGNAL MARGIN TESTING SYSTEM FOR DYNAMIC RAM

[75] Inventors: Edward Butler, Jonesville; Wayne F. Ellis, Jericho; Theodore M. Redman, Milton; Endre P. Thoma, Colchester, all of Vt.

[73] Assignee: International Business Machines Corporation, Armonk, N.Y.

[21] Appl. No.: 764,103

[22] Filed: Sep. 17, 1991

Related U.S. Application Data

[63] Continuation of Ser. No. 469,885, Dec. 28, 1989, abandoned.

[51] Int. Cl.$^5$ .......................... G11C 7/00; G11C 29/00
[52] U.S. Cl. .............................. 365/201; 365/189.11
[58] Field of Search ...................... 365/189.09, 189.11, 365/201, 226; 371/21.1, 21.2, 21.4

[56] References Cited

U.S. PATENT DOCUMENTS

| | | | |
|---|---|---|---|
| 4,468,759 | 8/1984 | Kung et al. | 365/201 |
| 4,482,985 | 11/1984 | Itoh et al. | 365/226 |
| 4,748,349 | 5/1988 | McAlexander, III et al. | 365/189.11 |
| 4,751,679 | 6/1988 | Dehganpour | 365/201 |
| 4,771,407 | 9/1988 | Takemae et al. | 365/189.11 |
| 4,860,259 | 8/1989 | Tobita | 365/189.11 |
| 4,868,823 | 9/1989 | White, Jr. et al. | 365/201 X |
| 4,951,257 | 8/1990 | Imamiya et al. | 365/189.09 |
| 5,018,101 | 5/1991 | Kajigaya et al. | 365/189.11 |
| 5,099,143 | 3/1992 | Arakawa | 365/189.09 |
| 5,117,426 | 5/1992 | McAdams | 365/201 X |
| 5,179,539 | 1/1993 | Horiguchi et al. | 365/226 |

FOREIGN PATENT DOCUMENTS

| | | |
|---|---|---|
| WO8200896 | 3/1982 | European Pat. Off. . |
| 0080935 | 11/1982 | European Pat. Off. . |
| 323221 | 3/1984 | European Pat. Off. . |
| 0212946 | 8/1986 | European Pat. Off. . |
| 60-85493 | 5/1985 | Japan | 365/189.11 |

OTHER PUBLICATIONS

Research Disclosure, May 1987, No. 277, p. 27718, published by Kenneth Mason Publications Ltd, England, article entitled "CMOS Memory Sorted for Yield Versus Reliability" by K. S. Gray et al.

Primary Examiner—Joseph L. Dixon
Assistant Examiner—Michael A. Whitefield
Attorney, Agent, or Firm—Stephen J. Limanek; Mark F. Chadurjian

[57] ABSTRACT

A signal margin testing system is provided for a memory having a word line voltage boosting circuit which uses a test mode decode circuit to selectively disable the word line boosting circuit and then read out data from storage cells in the memory.

15 Claims, 2 Drawing Sheets

SIGNAL MARGIN TESTING SYSTEM FOR DYNAMIC RAM

This is a continuation of copending application Ser. No. 07/469,885 filed on Dec. 28, 1989, abandoned.

TECHNICAL FIELD

This invention relates to signal margin testing systems for semiconductor integrated circuits and, more particularly, to systems for testing signal margins in high performance semiconductor memory circuits, and preferably in large scale dynamic random access memory systems, at chip, wafer or module levels.

BACKGROUND ART

Testing semiconductor integrated circuits is well known, including the use of test modes for module level testing of dynamic random access memories providing memory chips and circuits with a plurality of test mode options to insure product reliability.

In U.S. Pat. No. 4,468,759, granted to R. I. Kung et al, there is disclosed a testing system or method for dynamic random access memories wherein a higher stored reference voltage in the dummy cells is used when reading binary ones from the memory and a lower dummy reference is used when reading binary zeroes to predict the memory's performance under stressful environmental conditions before packaging the memory chip.

U.S. Pat. No. 4,751,679, granted to S. Dehganpour, discloses a test mode in a dynamic random access memory wherein gates of all transfer devices of the memory cell are subjected to a voltage stress test to provide an accelerated test of the integrity of the gate insulator.

In an article entitled "CMOS Memory Sorted for Yield Versus Reliability" by K. S. Gray et al, in Research Disclosure, May 1987, Number 277, page 27718, published by Kenneth Mason Publications Ltd, England, there is disclosed a system for sorting semiconductor memory chips for high reliability applications by testing for an acceptable output signal from chips without the use of bootstrapped word lines and for high yield of chips for use in applications not requiring the higher reliability with the use of bootstrapped word lines. Word line bootstrapping is enabled on chips by blowing a fuse or changing a D.C. voltage level on a pad.

DISCLOSURE OF THE INVENTION

It is an object of this invention to provide a simple and effective system for signal margin testing in an integrated semiconductor memory by changing the amount of signal on a bit line by a known amount which is a function of process parameters such as the threshold voltage of cell transfer devices and their lengths and widths, temperature, voltage and the technology used in designing the memory circuits to determine reliability, i.e., the projected length of life of the memory.

In accordance with the teachings of this invention, a signal margin testing system is provided for a memory having a word line voltage boosting or voltage increasing circuit by using a test mode decode circuit to selectively disable the word line boosting circuit and then reading out data from storage cells in the memory.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
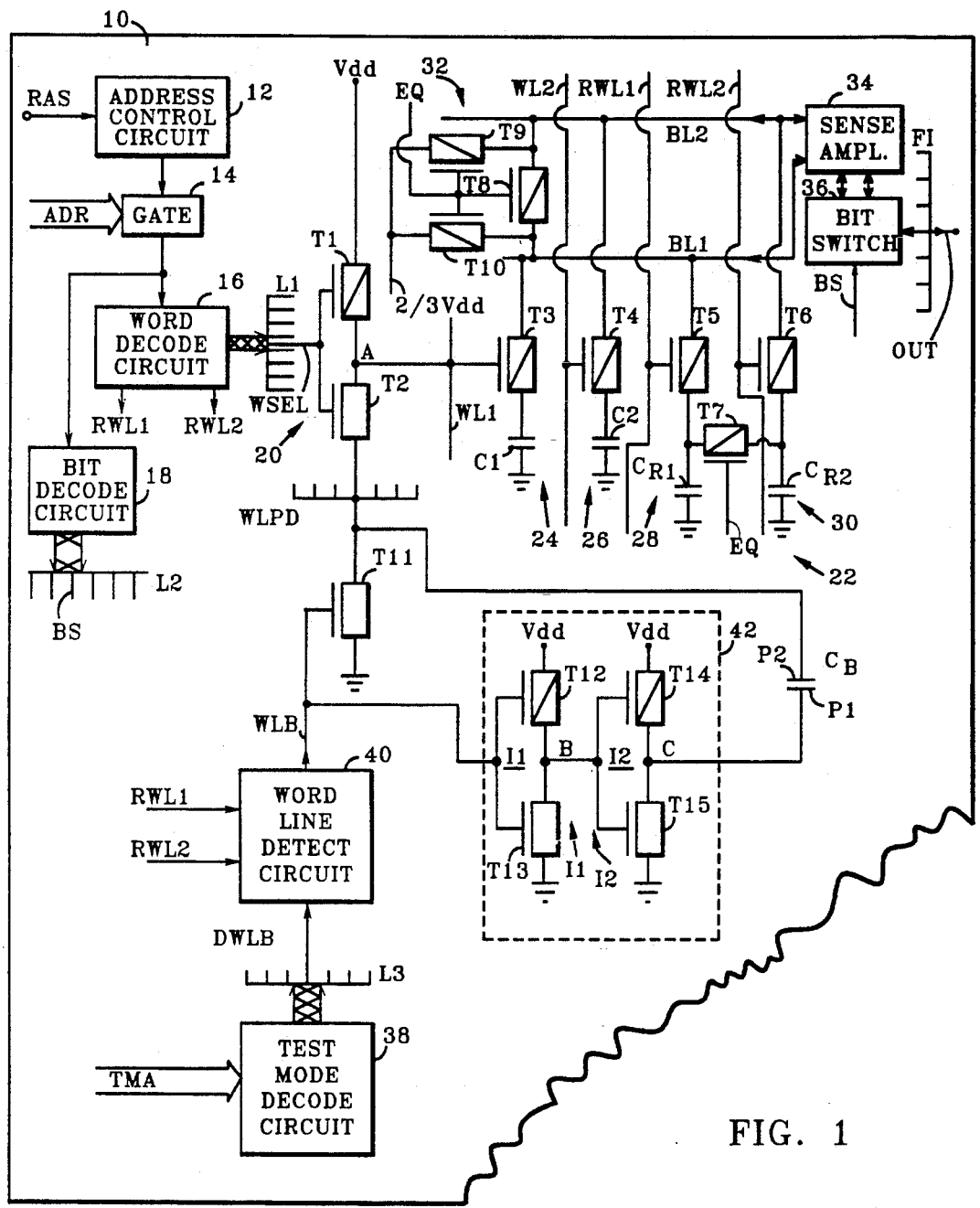
FIG. 1 is a circuit diagram, partly in block form, of a dynamic random access memory and signal margin testing system of the present invention.

Referring to FIG. 1 of the drawings in more detail, there is shown a circuit diagram, partly in block form, of a preferred embodiment of the signal margin testing system of the present invention. The circuit of the preferred embodiment of the test system of the present invention is made in complementary metal oxide semiconductor (CMOS) technology with P-channel field effect transistors indicated in the drawings by a rectangle with a diagonal line formed therein and a control or gate electrode arranged adjacent thereto and with N-channel field effect transistors indicated by a rectangle without a diagonal line and a control or gate electrode arranged adjacent thereto. The system of the present invention illustrated in FIG. 1 of the drawings includes a semiconductor chip or substrate 10, which may be made of silicon, packaged in module form, having pads or pins Vdd for applying an external supply voltage, RAS for row, or word line, address strobe pulses, ADR for word line and bit line addresses and OUT for output data signals.

An address control circuit 12 has an input connected to the RAS pad and a gate 14 has a first input connected to the output of the address control circuit 12 and additional inputs connected to the address ADR pads. A word decode circuit 16 has an input connected to the output of the gate 14 and a first plurality of output lines L1, one of which is identified as a selected line WSEL, and a second plurality of output lines identified as a first reference word line RWL1 and a second reference word line RWL2. Also connected to the output of the gate 14 is a bit decode circuit 18 having a plurality of output lines L2, one of which is identified as a bit switch line BS. The output line WSEL from the word line decode circuit 16 is connected to a first word line driver 20 having a P-channel field effect transistor T1 serially connected with an N-channel field effect transistor T2 with the source of the transistor T1 being connected to the Vdd pad, to which is applied preferably a voltage of 3.6 volts, the common point between the transistors being an output identified as node A and a control electrode of each of the transistors T1 and T2 being connected to the selected line WSEL.

An array of memory cells 22 is indicated by a first cell 24 and and a second cell 26. The cell 24 includes a transfer device shown as a P-channel field effect transistor T3 having a first current carrying electrode connected to a first bit line BL1 and a second current carrying electrode connected to one side of a storage capacitor $C_1$, with the other side of the capacitor $C_1$ being connected to a reference potential such as ground. A control electrode of the transistor T3 is connected to a first word line WL1 and the output A of the driver 20. The second cell 26 includes a P-channel field effect transistor T4 having a first current carrying electrode connected to a second bit line BL2 and a second current carrying electrode connected to one side of a storage capacitor $C_2$, with the other side of the capacitor $C_2$ being connected to ground. A control electrode of the transistor T4 is connected to a second word line WL2 coupled to an output of a second word line driver (not shown).

A first voltage reference cell 28 includes a transfer device shown as P-channel field effect transistor T5 having a first current carrying electrode connected to the first bit line BL1 and a second current carrying electrode connected to one side of a dummy cell or reference voltage capacitor $C_{R1}$, with the other side of the capacitor $C_{R1}$ being connected to ground. A control electrode of the transistor T5 is coupled to the reference word line RWL1, which originated at the word decode circuit 16. A second voltage reference cell 30 includes a P-channel field effect transistor T6 having a first current carrying electrode connected to the second bit line BL2 and a second current carrying electrode connected to one side of a dummy cell or reference voltage capacitor $C_{R2}$, with the other side of the capacitor $C_{R2}$ being connected to ground. A control electrode of the transistor T6 is coupled to the reference word line RWL2. As indicated hereinabove, the reference word lines RWL1 and RWL2 originate at the word decode circuit 16 but, as is known, driver circuits (not shown) are generally used before a voltage from RWL1 or RWL2 is applied to the control electrodes of either transistors T5 or T6. A first equalizing transistor of the P-channel field effect type T7 is connected between the one side of the capacitors $C_{R1}$ and $C_{R2}$, with a control electrode of the transistor T7 being connected to an equalizing line EQ. An equalizing and bit line voltage charging circuit 32 includes a second equalizing transistor T8 of the P-channel field effect type connected between the first and second bit lines BL1 and BL2 and a first and second bit line charging transistors T9 and T10 of the P-channel field effect type, the transistor T9 being connected between the second bit line BL2 and a source of fixed potential, such as ⅔ of Vdd, which may be provided by any suitable on-chip voltage generator, and the transistor T10 being connected between the first bit line BL1 and the fixed potential source.

A sense amplifier circuit 34 has first and second inputs connected to the first and second bit lines BL1 and BL2, respectively. A bit switch circuit 36 has first and second inputs connected to first and second outputs, respectively, of the sense amplifier circuit 34 and an output coupled through a fan-in circuit FI to a data output terminal, pad or pin, OUT. Although not shown, it should be understood that the output of the bit switch circuit 36 is generally coupled to terminal OUT through, e.g., a final amplifier stage and an output drive stage.

Test mode address signals TMA received from the address ADR pads are applied to a test mode address decode circuit 38. Generally the test mode address signals TMA are applied to a plurality of pads or pins ADR, the number of pads or pins depending upon the number of test modes associated with a particular memory or chip. For example, if the memory is designed to be tested by four test modes, then only two of the pads or pins ADR would be required since two decode circuit inputs, each containing binary information, is all that is required for a decode circuit to select any one of the four test modes. The output of the test mode decode circuit 38 is indicated by a plurality of lines L3 with one of the lines identified as DWLB being connected to a first input of a word line detect circuit 40. The word line detect circuit 40 also has second and third inputs connected to the first and second reference word lines RWL1 and RWL2, respectively. An output WLB from the word line detect circuit 40 is connected to a control electrode of a ground transistor T11 which is of the N-channel field effect type. A first current carrying electrode of the transistor T11 is connected to ground and a second current carrying electrode of the transistor T11 is connected to a fan-out identified as a word line pull down WLPD with one line being connected to the source electrode of the transistor T2 of the first word line driver 20.

The output WLB of the word line detect circuit 40 is also connected to an input of a buffer circuit 42 which includes first and second inverters I1 and I2. The first inverter I1 includes a P-channel field effect transistor T12 serially connected with an N-channel field effect transistor T13 with the source of the transistor T12 being connected to the supply voltage source Vdd and the source of the transistor T13 being connected to ground. A control electrode of each of the transistors T12 and T13 is connected to the output WLB of the word line detect circuit 40. The output of the inverter I1 is indicated at node B. The second inverter I2 includes a P-channel field effect transistor T14 serially connected with an N-channel field effect transistor T15 with the source of the transistor 14 being connected to the supply voltage source Vdd and the source of the transistor T15 being connected to ground. A control electrode of each of the transistors T14 and T15 is connected to the output node B of the first inverter I1. The output of the second inverter I2 is indicated at node C. A boost capacitor $C_B$, for increasing the drive voltage at the gate electrode of the transfer devices or transistors, such as transistors T3 and T4, has a first plate P1 connected to the output node C of the buffer circuit 42 and a second plate P2 connected to the fan-out WLPD and the second current carrying electrode or drain of the ground transistor T11.

Figure 2:
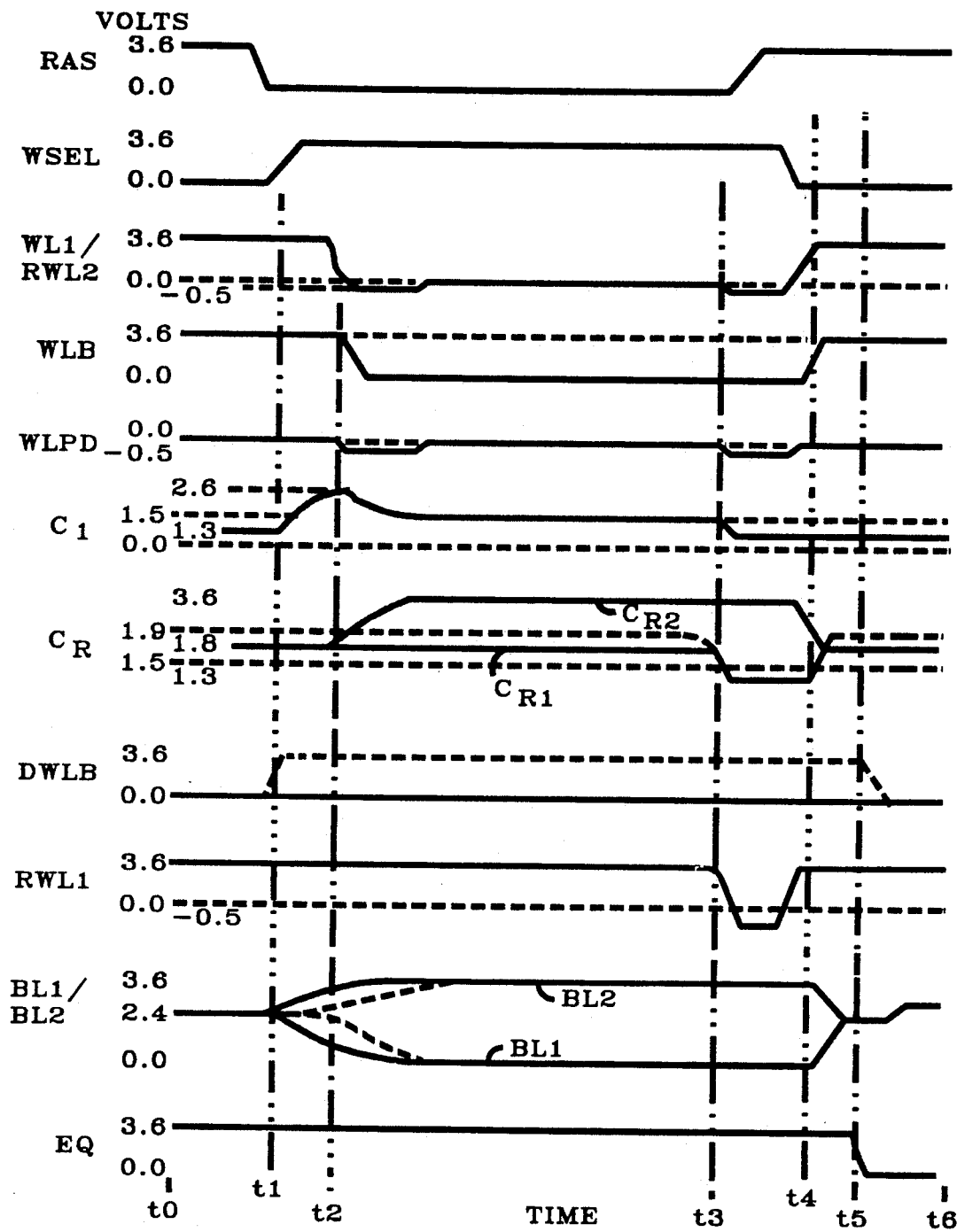
FIG. 2 is a pulse program used in connection with the description of the operation of the memory and test system shown in FIG. 1 of the drawings.

For a better understanding of the operation of the signal margin testing system of the present invention reference may be had to the pulse diagram or program shown in FIG. 2 of the drawings, as well as to the circuit diagram shown in FIG. 1. First consider the normal operation of the dynamic random access memory indicated by the array 22 in FIG. 1 of the drawings when the voltage on the word lines WL1 or WL2, and on the reference word lines RWL1 or RWL2, is boosted or driven to a voltage below ground, such as to −0.5 volts, to boost the drive voltage at the transfer devices which provides strong signals at the input of the sense amplifier 34 and improved performance of the memory.

Referring to the solid lines in the graphs of FIG. 2 of the drawings, it can be seen that at time t0 the voltage is high, e.g., at 3.6 volts, at RAS, WL1, RWL1, RWL2, and at EQ, and the voltage is low, e.g., at ground, at WSEL, WLPD and DWLB. Also at time t0, the voltage on the storage capacitor $C_1$ is at about 1.3 volts, on each of the reference voltage capacitors $C_{R1}$ and $C_{R2}$ is about 1.8 volts and on each of the bit lines BL1 and BL2 is at about 2.4 volts.

As is known, to begin an active cycle for either reading or writing a memory cell, or for both reading and writing, a row address strobe pulse RAS is turned on to an active level. In this instance, at time T1 RAS falls to 0 volts to begin an active cycle causing the address control circuit 12 to turn on or open the gate 14. With the gate 14 turned on or opened, the row or word addresses pass to the word decode circuit 16 which selects one of the lines L1, in this instance the word select line being WSEL wherein the voltage rises to 3.6 volts. At this time the word decode circuit 16 also selects one of the reference word lines RWL1 or RWL2, in this instance line RWL2 being selected. Shortly after time T1, column or bit addresses pass through the gate 14 to the bit decode circuit 18 which selects one line of the plurality of lines L2, in this instance line BS being selected.

With the voltage on the word select line WSEL high, transistor T2 of the word driver 20 turns on to discharge the first word line WL1 causing the transistor T3 of the first cell 24 to turn on. Meanwhile, the voltage on reference word line RWL2, which is also coupled to a driver (not shown) similar to that of the word line driver 20, also begins to discharge. At time t2, after line RWL2 discharges to approximately 1 volt, the word line detect circuit 40 causes the voltage on the word line boost WLB to go to 0 volts turning off the ground transistor T11, and turning on the transistor T12 and turning off the transistor T13 of the first inverter of the buffer circuit 42, which then turns on the transistor T15 and turns off the transistor T14 of the second inverter I2. With the transistor T15 being turned on, the voltage on the plate P1 of the boost capacitor $C_B$, previously charged through the transistor T14, begins to fall toward ground causing the voltage on the second plate P2, previously at ground as indicated by the voltage at the word line pull down WLPD due to the transistor T11 being on, to fall below ground to a voltage of about −0.5 volts as indicated by the graph at WLPD in FIG. 2.

With the voltage at the word line pull down WLPD at −0.5 volts and the word line WSEL at 3.6 volts, the transistor T2 is turned on hard to bring the first word line WL1 also to −0.5 volts. The first word line WL1 being at −0.5 volts and the first bit line BL1 being at 2.4 volts, the transfer transistor T3 is turned on hard to rapidly transfer cell charge to the first bit line BL1, as indicated in the graph of FIG. 2 at time t2. The rapid rise in voltage on the storage capacitor $C_1$ is indicated in the graph of FIG. 2 between approximately times T1 nd t2. It should be noted that while the transistor T3 is being turned on by the voltage n the first word line WL1, the transistor T6 of the second voltage reference cell 30 is being turned on by the voltage on the second reference word line RWL2. However, since the reference voltage on the reference capacitor $C_{R2}$ is initially higher than the voltage on the first storage capacitor $C_1$, voltage on the reference capacitor $C_{R2}$ continues to rise until it reaches approximately 3.6 volts due to amplification of the bit line signal in the sense amplifier 34 to which the bit lines BL1 and BL2 are connected. After time t2, the sense amplifier 34 is turned on by known means to read out the information stored in the storage cell $C_1$ of the first storage capacitor. The voltage on the first bit line BL1 continues to decrease until it reaches 0 volts and the voltage of the second bit line BL2 continues to increase until it reaches the supply voltage source value of 3.6 volts. This information is passed on to the output terminal OUT through the bit switch circuit 36 which is turned on by the voltage on line BS from the bit decode circuit 18. It should be noted that this read out is very reliable and is performed very rapidly due to the boosting action provided by the boost capacitor $C_B$.

After the storage cell has been read out and while the bit lines BL1 and BL2 continue to hold the previously stored information, the storage capacitor $C_1$ is rewritten with the original information. To rewrite the information, at time t3 the voltage on the reference capacitor $C_{R1}$ and the storage capacitor $C_1$ is decreased to 1.3 volts by a second boosting of WLPD below ground by operation of the word decode circuit 16 with the first reference word line RWL1 being turned on or at an active level and connected (not shown) to the fan-out WLPD. The voltage on the line WSEL remains high and the voltage on the line WLB remains low until after the information on the bit lines BL1 and BL2 has been rewritten into the first cell 24. After the information has been rewritten, the voltages on WL1, RWL1 and RWL2 return to their high values at time t4. The reference voltages on the reference capacitors $C_{R1}$ and $C_{R2}$ are equalized by turning on the equalizing transistor T7 at time t5 with a pulse EQ. The pulse EQ may be generated when both reference word line pulses RWL1 and RWL2, and word line boost WLB, go to a high value at time t4 by connecting the word line boost WLB to equalizing circuit (not shown). Also the voltages on the bit lines BL1 and BL2 are similarly equalized by turning on the equalizing transistor T8 of the equalizing and voltage charging circuit 32. While equalizing the voltages on the bit lines BL1 and BL2, the bit lines are also charged to a value such as ⅔ the voltage of Vdd by connecting a ⅔ Vdd voltage generator (not shown) to the bit line through the transistors T9 and T10 which are also controlled by the voltage or pulse EQ. At time t6 all lines, pads and terminals are restored to the same values found at time t0.

To perform signal margin testing of the information stored in the storage capacitor $C_1$ of the first memory cell 24, test mode address signals TMA received from the address ADR pads are applied to the test mode decode circuit 38 so as to select the disable word line boost DWLB of the plurality of lines L3 at time t1 after the RAS voltage drops to 0 volts. Thereafter, the voltage on line DWLB is increased to 3.6 volts so as to render the word line detect circuit 40 non-responsive to voltages on either of the reference word lines RWL1 or RWL2 by any suitable means. Accordingly, as indicated in the graph by a dashed line at WLB between times t1 and t4, the voltage on line WLB will remain high and, therefore, the transistor T11 will remain on continuously to maintain the voltage at the fan-out or the word line pull down WLPD at ground level throughout the entire active cycle. Meanwhile, the word decode circuit has selected the line WSEL which turns on the transistor T2 of the word line driver 2-0. Since the voltage on the word line pull down WLPD is only at ground potential and not at the boosted or lower voltage of −0.5 volts, the transistor T3 does not turn on as hard during this signal margin testing cycle of operation as it did during the normal operation with the boosted or lower word line voltage. Accordingly, the voltage on the bit line BL1 does not drop as rapidly, as indicated by the dashed line at BL1 of the graph in FIG. 2 of the drawings, as it did with the boost or lower voltage on the word line WL1. Consequently, the sense amplifier 34 does not cause the voltage on the second bit line BL2 to rise as rapidly as it dud during normal boosted operation.

Since the difference in the voltages on the bit lines BL1 and BL2 at time t2 when the sense amplifier 34 is turned on is significantly less than it was during normal boosted operation, as indicated by the dashed lines in FIG. 2 of the drawings, the sense amplifier will detect only signals which are derived from storage capacitors, such as capacitor $C_1$ of the first memory cell 24, which contain at least a given level of charge at time t2. Accordingly, this signal margin test will identify those cells in the memory which are capable of producing sufficiently strong signals on the bit lines BL1 and BL2 to be sensed by the sense amplifier 34 at time t2 without the use of a boost or lower voltage on the word line WL1. Since such signals are strong enough to be detected during the read operation without the use of a word line boost voltage, this system provides a very valuable measure of signal strength of the memory.

It should be noted that this test can be performed after the chip has been packaged as a module since access to the memory for test purposes is through available address ADR pins located on the module. It should be understood that when the information read out during the test operation is rewritten into the cells, the voltage at the storage cell $C_1$ is at 1.5 volts as indicated by the dashed line at $C_1$ of the graph in FIG. 2 of the drawings. It should also be noted that the operation of the system has been described with a "0" binary digit or low voltage stored in the first cell 24, however, it can be seen that the system provides similar advantages when a "1" binary digit or high voltage is stored in the first cell 24. The most significant difference when a high voltage is stored in the first cell 24 is that the first bit line BL1 would be charged rapidly between times t1 and t2 when the boosted voltage is applied to the first word line WL1 and through feedback action in the sense amplifier 34 the voltage on the second bit line BL2 would fall rapidly. During the test operation, similar action takes place but with the bit line voltage providing a boosted or increased drive, values being indicated by the dashed lines in the graphs BL1 and BL2 of FIG. 2 of the drawings. It should be understood that when the information is read from capacitor $C_1$, the reference cell voltage at the capacitors $C_{R1}$ and $C_{R2}$ has been similarly modified, so as to reduce signal strength on the bit lines.

Although the memory array 22 has been shown with only two cells 24 and 26, it should be understood that each of the bit lines may have connected thereto numerous cells, and that the memory array 22 may contain, if desired, hundreds of bit line pairs and hundreds of word lines. Furthermore, it should be understood that P-channel field effect transistors have been shown for, e.g., the transfer devices T3 through T6, however, fi desired, N-channel field effect transistors may be substituted therefor with appropriately known changes in voltage polarities.

Although the test mode address pulses have been used to initiate this test mode, it should be understood that other voltages may be used to disable the word line boost.

It can be seen that a signal margin testing system has been provided which is simple to implement via a test mode sequence at either module or system level or even at wafer test and due to easy access to the memory has the potential to save test time. Furthermore, it should be understood that this boost disable technique for testing, results in a discrete amount of signal reduction that relates to process, temperature and voltage. This discrete amount of signal reduction provides a valuable parameter to accurately measure the quality of a memory chip. No additional external voltages or pins are required to implement this technique, and there is no added chip noise.

While the invention has been particularly shown and described with reference to preferred embodiments thereof, it will be understood by those skilled in the art that various changes in form and detail may be made therein without departing from the spirit and scope of the invention.

What is claimed is:

1. An apparatus for carrying out a test sequence in a memory system wherein selected dynamic random access memory cells are accessed for reading or writing during a normal access cycle, each of the memory cells comprising a transistor having a control electrode receiving an access signal, a first current carrying electrode coupled to an output line, and a second current carrying electrode, and storage means coupled to the second current carrying electrode of said transistor, said apparatus for carrying out said test sequence comprising first means including a boost capacitor for boosting the access signal at least once during the normal access cycle, second means responsive to first address signals for detecting that the memory is in a test mode, and third means responsive to second address signals and to the second means for preventing the first means from operating for at least one complete access cycle during the test mode.

2. A signal margin testing system comprising a memory array having a first word line, a source of address signals, a word line driver, first means coupled to said source of address signals including a voltage boosting circuit controlled by said address signals for applying a first voltage of a given magnitude to said word line through said word line driver in a normal operating state during a first interval of time in a first read cycle, and second means including a test mode decode circuit coupled to said source of address signals and responsive to said address signals for rendering said voltage boosting circuit inoperative in a test mode during a second interval of time in a second read cycle for applying a second voltage of a magnitude less than said given magnitude to said first word line through said word line driver.

3. A signal margin testing system as set forth in claim 2 wherein the magnitude of said first voltage is negative compared to said second voltage.

4. A signal margin testing system as set forth in claim 2 wherein said voltage boosting circuit includes a capacitor.

5. A signal margin testing system as set forth in claim 4 wherein said second means responsive to said address signals includes a test mode decode circuit.

6. A signal margin testing system comprising a memory array having a first word line, a source of address signals, first means coupled to said source of address signals including a voltage boosting circuit having a capacitor and a word line detect circuit having first and second inputs and an output controlled by said given address signals for applying a first voltage of a given magnitude to said word line in a normal operating state during a first interval of time, said output being coupled to said voltage boosting circuit, and second means including a test mode decode circuit coupled to said source of address signals and responsive to said address signals for rendering said voltage boosting circuit inoperative in a test mode during a second interval of time for applying a second voltage of a magnitude less than said given magnitude to said first word line, the first input of said word line detect circuit being connected to an output of said test mode decode circuit.

7. A signal margin testing system comprising
a memory array having a first word line,
a source of address signals,
first means coupled to said source of address signals including a voltage boosting circuit controlled by said address signals for applying a first voltage of a given magnitude to said word line in a normal operating state during a first interval of time, and
second means coupled to said source of address signals and responsive to said address signals for rendering said voltage boosting circuit inoperative in a test mode during a second interval of time for applying a second voltage of a magnitude less than said given magnitude to said first word line, the magnitude of said first voltage being negative compared to said second voltage, said first voltage having a magnitude of $-0.5$ volts and said second voltage having a magnitude of zero volts.

8. A signal margin testing system comprising
a memory array having a first word line and a reference word line,
means including a word line detect circuit and a voltage boosting circuit having a capacitor for applying a first voltage of a given magnitude to said word line in a normal operating state during a first interval of time, said word line detect circuit having first and second inputs and an output, said output being coupled to said voltage boosting circuit, and
means including a test mode decode circuit responsive to a signal for rendering said voltage boosting circuit inoperative in a test mode during a second interval of time for applying a second voltage of a magnitude less than said given magnitude to said first word line, the first input of said word line detect circuit being connected to an output of said test mode decode circuit and he second input of said word line detect circuit being connected to said reference word line.

9. A signal margin testing system comprising
a memory array including at least a first word line and a reference word line,
a driver connected to said first word line,
first means coupled to said driver for applying to said first word line a voltage of a first magnitude in a normal operation during a first interval of time through a first circuit including a capacitor and a voltage of a second magnitude in a test mode during a second interval of time through a second circuit including a transistor, and
second means, including a word line detect circuit and a test mode decode circuit, coupled to said first means for applying to said word line responsive to a first signal derived from a signal on said reference word line for activating said first circuit during said first interval of time and to a second signal being an address signal for activating said second circuit during said second interval of time, said word line detect circuit being responsive to said first signal and said test mode detect circuit having an output connected to an input of said word line detect circuit being responsive to said second signal.

10. A signal margin testing system as set forth in claim 9 further including
first and second bit lines, and
a sense amplifier having first and second inputs connected to said first and second bit lines, respectively, and
wherein said memory further includes
a data storage cell connected to said first word line and to said bit line and
a voltage reference cell connected to said reference word line and to said second bit line.

11. A signal margin testing system comprising
a memory array including at least a first word line having an access signal thereon of a first magnitude during a normal operation of said array and of a second magnitude less than said first magnitude during a test mode of said array,
a driver connected to said first word line,
a source of address signals,
first means including a voltage boosting circuit coupled to said driver and said source of address signals and responsive to said address signals for applying to said first word line through said driver in a first given cycle an access signal of said first magnitude in said normal operation during a first interval of time, and
second means including a test mode circuit coupled to said first means and responsive to a first signal for rendering said voltage boosting circuit inoperative during said test mode to apply to said first word line through said driver in a second given cycle similar to that of said first given cycle an access signal having said second magnitude during a second interval of time.

12. A signal margin testing system comprising
pad means for receiving a plurality of addresses,
word decode means having first and second outputs,
means for applying a first address of said plurality of addresses to an input of said word decode means,
a word line driver having an input and an output, said word line driver input being coupled to the first output of said word decode means,
test mode decode means having inputs and an output, said inputs receiving a second address of said plurality of addresses,
word line detect means having first and second inputs and an output, said first input being coupled to the second output of said word decode means and said second input being coupled to the output of said test mode decode means,
a word line pull down node coupled to the output of said word line driver,
a transistor having a control electrode and a source-drain path disposed between said word line pull down node and a point of reference potential, said control electrode being coupled to the output of said word line detect means,
a capacitor having first and second plates, said first plate being coupled to said word line pull down node, and
a buffer circuit having an input coupled to the output of said word line detect means and an output coupled to the second plate of said capacitor.

13. A signal margin testing system as set forth in claim 12 wherein said transistor is an N-channel field effect transistor.

14. A signal margin testing system as set forth in claim 13 wherein said buffer circuit includes first and second inverters, each of said inverters including a P-channel field effect transistor serially connected with an N-channel field effect transistor.

15. A signal margin testing system as set forth in claim 12 further comprising a memory array including a first word line coupled to the output of said word line driver, a reference word line coupled to the second output of said word decode means, a storage cell and a reference voltage cell, sense amplifying means having first and second inputs, and first and second bit lines coupled to the first and second inputs, respectively, of said sense amplifying means, said storage cell being connected to said first word line and to said first bit line and said reference voltage cell being connected to said reference word line and to said second bit line.

* * * * *